(12) United States Patent
Bodony et al.

(10) Patent No.: US 6,307,751 B1
(45) Date of Patent: Oct. 23, 2001

(54) FLEXIBLE CIRCUIT ASSEMBLY

(75) Inventors: Lawrence A. Bodony, Lexington; Richard Bryan, Somerville; Jack W. Tseng, Canton, all of MA (US)

(73) Assignee: WearLogic, Inc., Wakefield, MA (US)

( * ) Notice: Subject to any disclaimer, the term of this patent is extended or adjusted under 35 U.S.C. 154(b) by 0 days.

(21) Appl. No.: 09/259,937

(22) Filed: Mar. 1, 1999

Related U.S. Application Data
(60) Provisional application No. 60/087,555, filed on Jun. 1, 1998.

(51) Int. Cl.[7] .................................................. H05K 1/00
(52) U.S. Cl. .......................... 361/749; 361/748; 361/681
(58) Field of Search .................................. 361/683, 749, 361/748, 760, 761; 364/708.1, 705; 482/4; 257/679, 723; 235/462, 492; 200/5 A; 340/825.44; 902/26; 343/893, 895; 439/946

(56) References Cited

U.S. PATENT DOCUMENTS

| | | |
|---|---|---|
| 3,911,234 | 10/1975 | Kotaka . |
| 4,075,702 | 2/1978 | Davies . |
| 4,096,577 | 6/1978 | Ferber et al. . |
| 4,104,728 | 8/1978 | Kasubuchi . |
| 4,181,964 | 1/1980 | Moore et al. . |
| 4,263,659 | 4/1981 | Hirata et al. . |
| 4,517,660 | 5/1985 | Fushimoto et al. . |
| 4,558,427 | 12/1985 | Takeuchi et al. . |
| 4,634,845 | 1/1987 | Hale et al. . |
| 4,670,853 | 6/1987 | Stepien . |
| 4,682,310 | 7/1987 | Lund et al. . |
| 4,689,478 | 8/1987 | Hale et al. . |
| 4,717,908 | 1/1988 | Phillips et al. . |
| 4,724,527 | 2/1988 | Nishimura et al. . |
| 4,760,918 | 8/1988 | Washizuka et al. . |
| 4,777,563 | 10/1988 | Teraoka et al. . |
| 4,862,153 | 8/1989 | Nakatani et al. . |
| 4,876,441 | 10/1989 | Hara et al. . |
| 5,241,680 | 8/1993 | Cole et al. . |
| 5,285,398 | 2/1994 | Janik . |
| 5,406,027 | * 4/1995 | Matsumoto et al. ................ 174/52.2 |
| 5,416,310 | 5/1995 | Little . |
| 5,434,362 | 7/1995 | Klosowiak et al. . |
| 5,436,744 | 7/1995 | Arledge et al. . |
| 5,491,651 | 2/1996 | Janik . |
| 5,506,395 | 4/1996 | Eppley . |
| 5,517,177 | 5/1996 | Cantrall . |
| 5,572,401 | 11/1996 | Carroll . |
| 5,581,492 | 12/1996 | Janik . |
| 5,646,446 | 7/1997 | Nicewarner, Jr. et al. . |
| 5,931,764 | * 8/1999 | Freeman et al. .......................... 482/4 |

FOREIGN PATENT DOCUMENTS

| | | |
|---|---|---|
| 539597 | 5/1993 | (EP) . |
| WO 9700598 | 1/1997 | (WO) . |
| WO 9802921 | 1/1998 | (WO) . |

* cited by examiner

*Primary Examiner*—Jeffrey Gaffin
*Assistant Examiner*—Thanh Y. Tran
(74) *Attorney, Agent, or Firm*—Wolf Greenfield & Sacks

(57) ABSTRACT

A completely flexible circuit is disclosed. In one embodiment, the flexible circuit includes a layer of flexible substrate having conductive material deposited on it. The flexible circuit also includes a plurality of components fixedly attached to the flexible substrate, and electrically interconnected by the conductive material. Also, the flexible circuit includes a flexible display screen attached to the at least one layer of flexible substrate and electrically coupled to at least one of the plurality of components.

48 Claims, 11 Drawing Sheets

FLEXIBLE CIRCUIT ASSEMBLY

This application claims benefit of Provisional application 60/087,555, filed Jun. 1, 1998.

BACKGROUND OF THE INVENTION

1. Field of the Invention

The present invention relates generally to the art of flexible circuit assemblies. More particularly, the present invention relates to a flexible circuit capable of operating as a wearable computer.

2. Related Art

A combination of a circuit and a display screen is commonly used for storing and displaying information to a user. Example circuit/display combinations include personal computers, calculators, and pocket organizers. In these devices the circuitry and display screens are typically encapsulated in rigid plastic casings. These casings are to protect the circuitry and screen, both of which are typically made of non-flexible materials. For example, computer components and their associated circuits are usually placed on a hard-plastic "mother board." The plastic of the mother board does not allow for significant flexibility and will snap if a sufficient amount of torque is applied to it. Display screens are also typically made of non-flexible glass and exhibit similar properties. These properties limit devices that are made from these components, from being operable in real-world environments, such as pockets and purses, where if not protected by a hard casing, the devices may break when sat upon or dropped.

SUMMARY OF THE INVENTION

In one embodiment, a sealed flexible circuit is disclosed. The flexible circuit includes at least one layer of flexible substrate, and conductive material deposited on the at least one layer of flexible substrate. The flexible circuit also includes a plurality of components, fixedly attached to the flexible substrate and electrically interconnected by the conductive material, and a flexible display screen attached to the at least one layer of flexible substrate and electrically coupled to at least one of the plurality of components.

In another embodiment a flexible computing device is disclosed. The flexible computing device includes a flexible substrate including a plurality of flexible layers, each layer being fixedly bonded to each adjacent layer such that when the flexible computing device is flexed, the plurality of layers act as a unitary member, the plurality of layers including a top layer. The flexible computing device also includes conductive material disposed on at least one of the plurality of layers, and a plurality of components, some of which are fixedly attached the top layer of flexible substrate, each component being electrically coupled to at least one other component by the conductive material. The flexible computing device also includes a flexible display screen attached to the top layer of the flexible substrate and electrically coupled to at least one of the plurality of components by a portion of the conductive material.

All of the various embodiments may be integrated into and operable in a flexible assembly such as a wallet or a wristband.

BRIEF DESCRIPTION OF THE DRAWINGS

Various aspects and embodiments of the present invention will be more clearly understood from the following detailed description and from the accompanying figures. This description is given by way of example only and in no way restricts the scope of the invention. In the figures.

FIG, 11 is an exploded view of one exemplary embodiment by which a display screen may be attached to and integrated in a flexible circuit.

Figure 12:
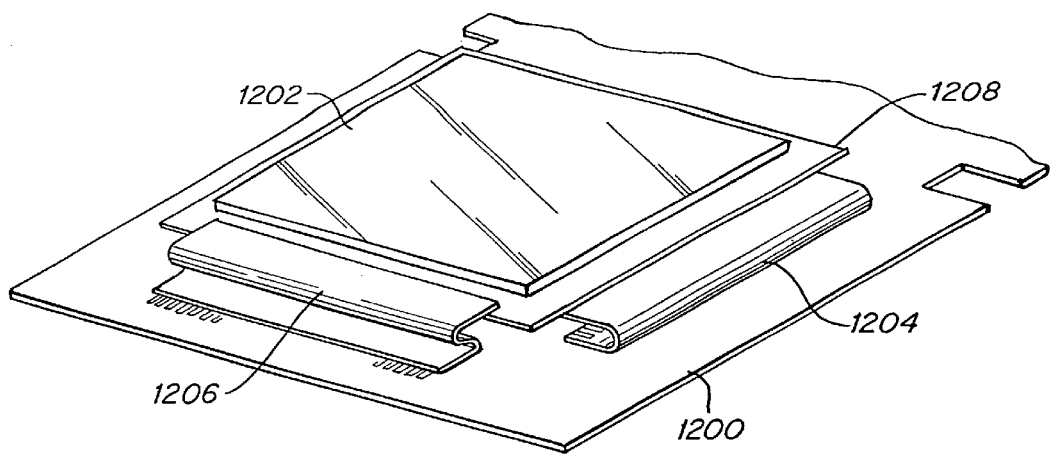

FIG. 12 is another exemplary embodiment by which a display screen may be attached to and integrated in a flexible circuit.

Figure 13:
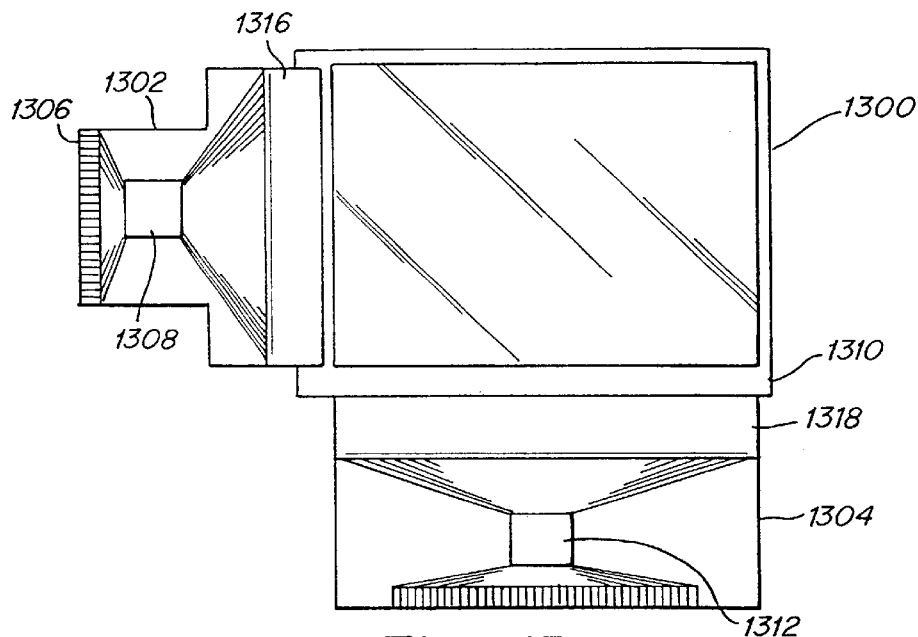

FIG. 13 is another exemplary embodiment by which a display screen may be attached to and integrated in a flexible circuit and includes various chips for driving the display.

Figure 14:
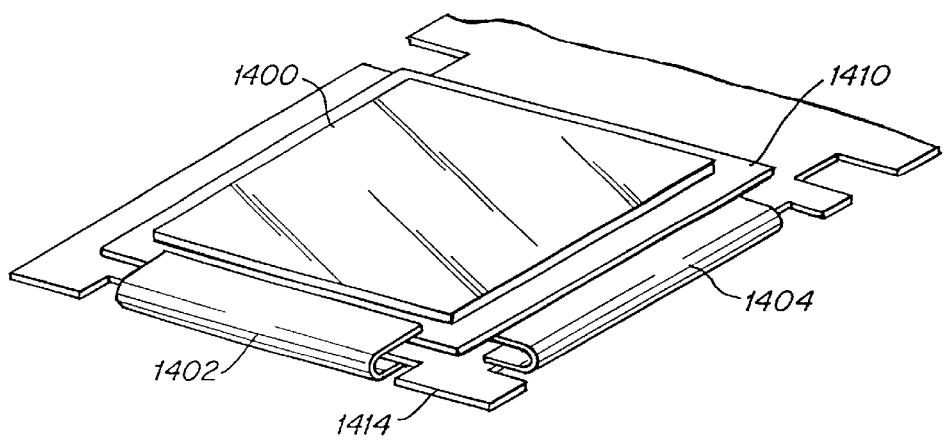

FIG. 14 is another exemplary embodiment by which a display screen may be attached to and integrated in a flexible circuit.

FIGS. 15A–15D disclose various aspects of connecting portions of conductive material across a hinge area.

Figure 16A:
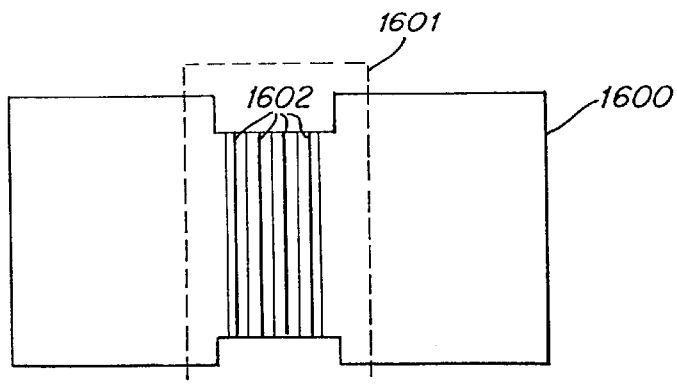
Figure 16B:
Figure 16C:
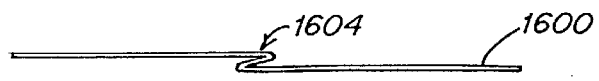

FIGS. 16A–16C show attributes that may be optionally implemented to that the effective length of the flexible circuit may be altered.

Figure 17A:
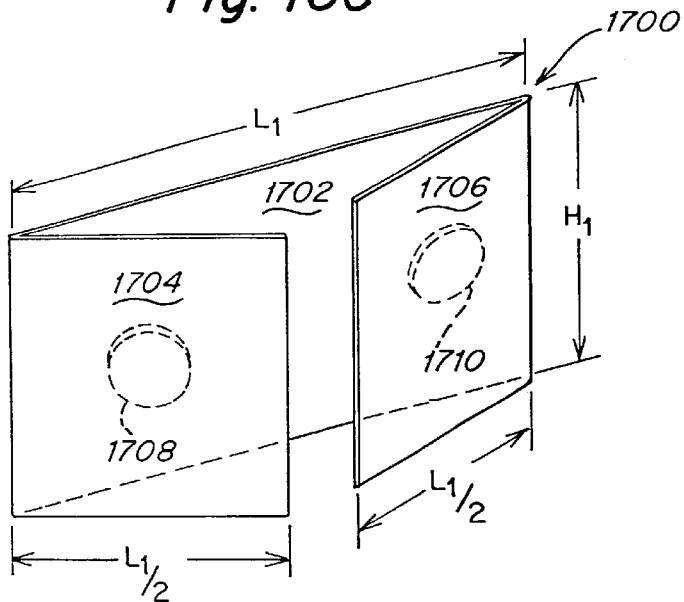
Figure 17B:
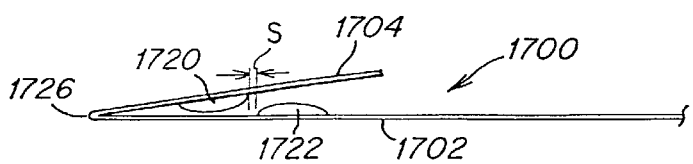

FIGS. 17A–17B are various aspects of preferred constructions of the flexible circuit of the present invention.

Figure 18A:
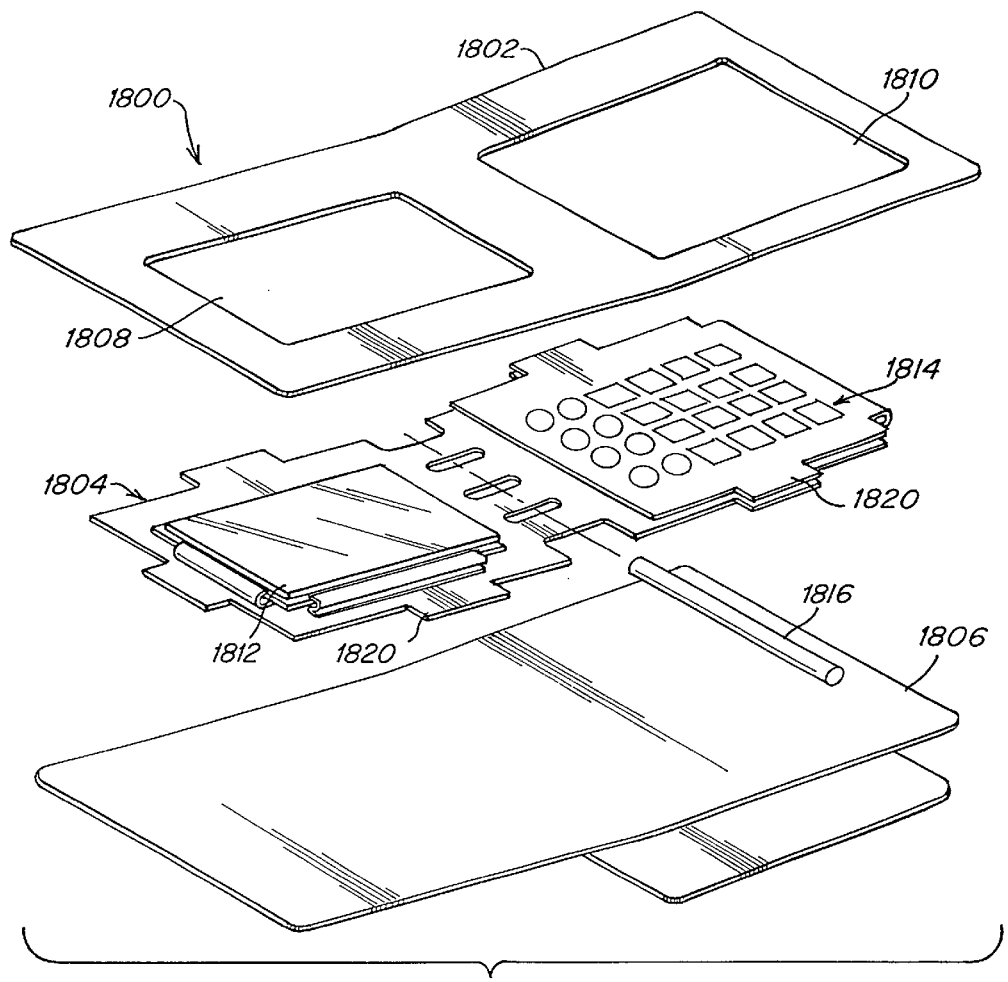
Figure 18B:
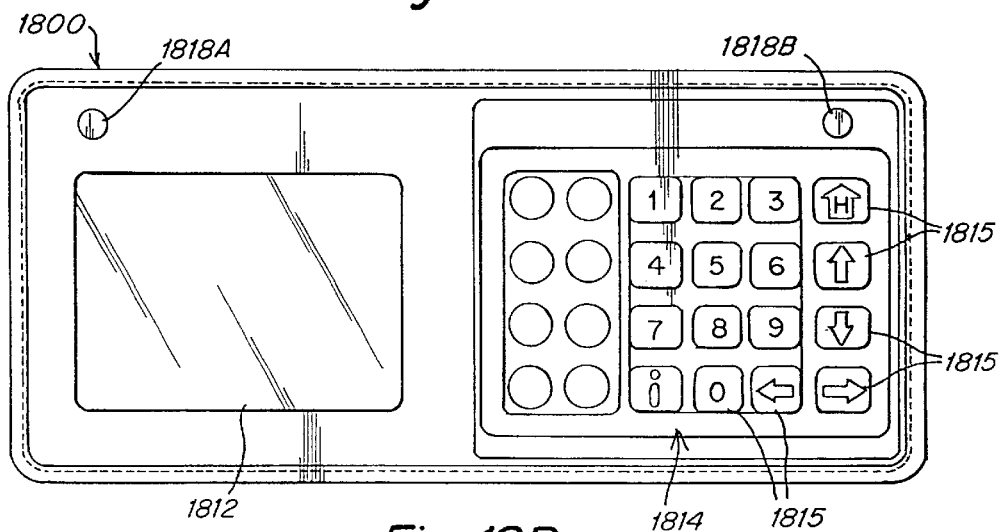

FIGS. 18A–18B are an exemplary flexible circuit integrated into a wallet.

Figure 19A:
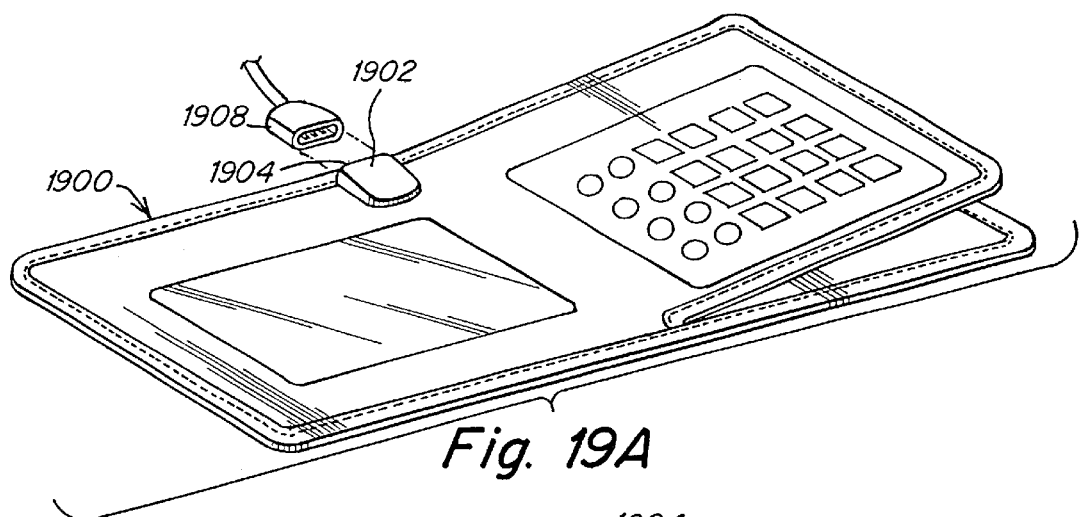
Figure 19B:
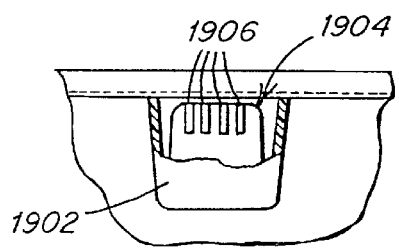
Figure 19C:
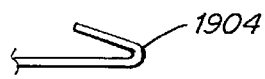

FIGS. 19A–C disclose aspects of an exemplary flexible circuit integrated into wallet and having an input port.

Figure 20:
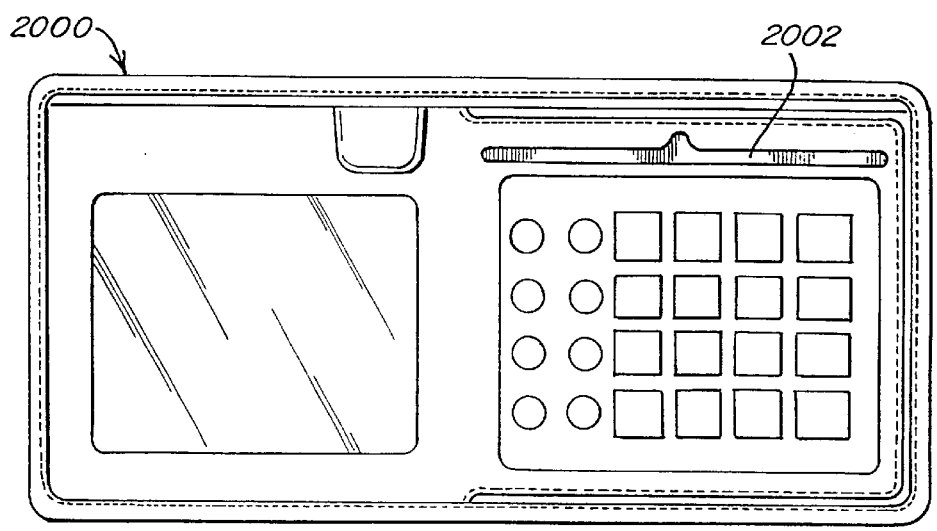

FIG. 20 discloses one embodiment of a flexible circuit integrated into wallet and having an opening for receiving a smart card.

Figure 21A:
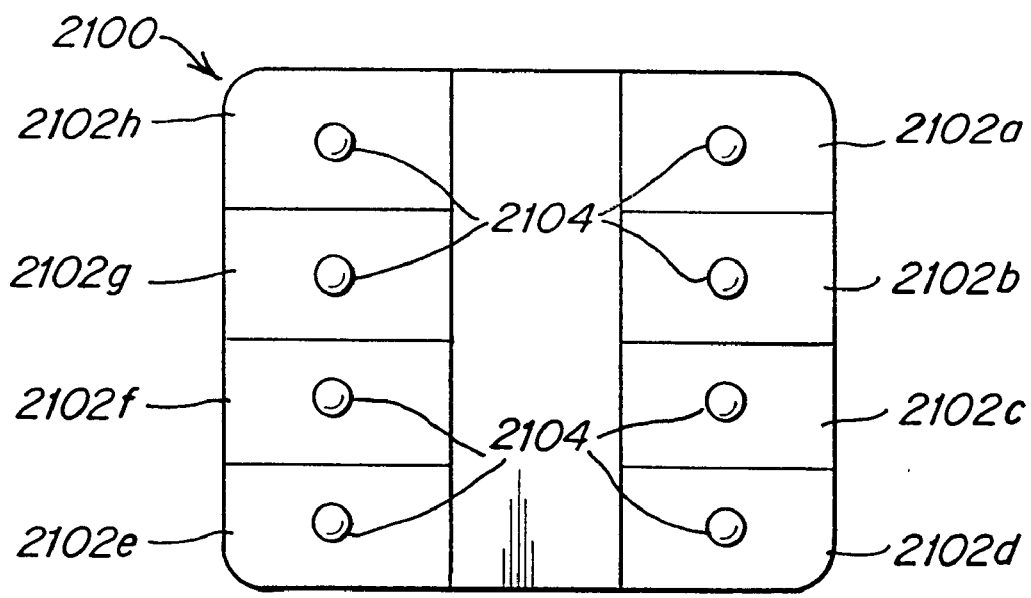
Figure 21B:
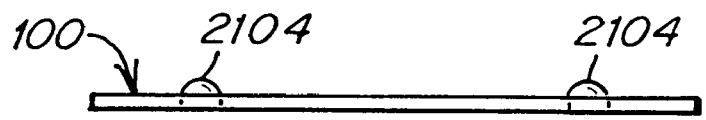

FIGS. 21A–21B disclose various aspects of an interface for communication with a smart card.

DETAILED DESCRIPTION

Most generally, one embodiment of the present invention includes an entirely flexible circuit having at least one, and preferably several, electrical components attached to it. The circuit also preferably includes a flexible display. In a preferred embodiment, the flexible display is a flexible liquid crystal display (LCD). As used herein, the term "flexible circuit" includes any electrical circuit and may be implemented, for example, as a computing device capable of receiving information and performing operations thereon.

A flexible circuit according to the present invention should be rugged enough so that it is resistant to several types of mechanical stress. Additionally, the circuit, in one embodiment, should be hermetically sealed so that it may withstand exposure to external elements such as water.

In order for the flexible circuit of the present invention to be integrated in to a flexible housing, such as a wallet or a wrist band, the flexible circuit should possess certain characteristics. For instance, the flexible circuit should be capable of withstanding, at least in a localized area, the repeated folding and unfolding the circuit will be exposed to if integrated into a wallet. In a preferred embodiment, the flexible circuit may also have a permanent crease placed in it so the flexible circuit is folded back on itself to increase overall surface area to attach components while keeping the total effective length to a minimum.

For example, the flexible circuit should remain operational even when repetitively folded and unfolded or subjected to stress due to torsion, shearing or compression. As used herein, the term "fold" will refer to both the crease as well as a hinge area. A crease may be defined as a fold in the flexible circuit that has a very small radius compared to the thickness of the flexible circuit. That is, when the flexible circuit is creased, two portions of the flexible circuit are substantially coplanar with one another. A hinge area is a larger fold having a larger radius of curvature such that when the flexible circuit is folded along a hinge area, two portions of the flexible circuit have a slight space between them.

Figure 1:
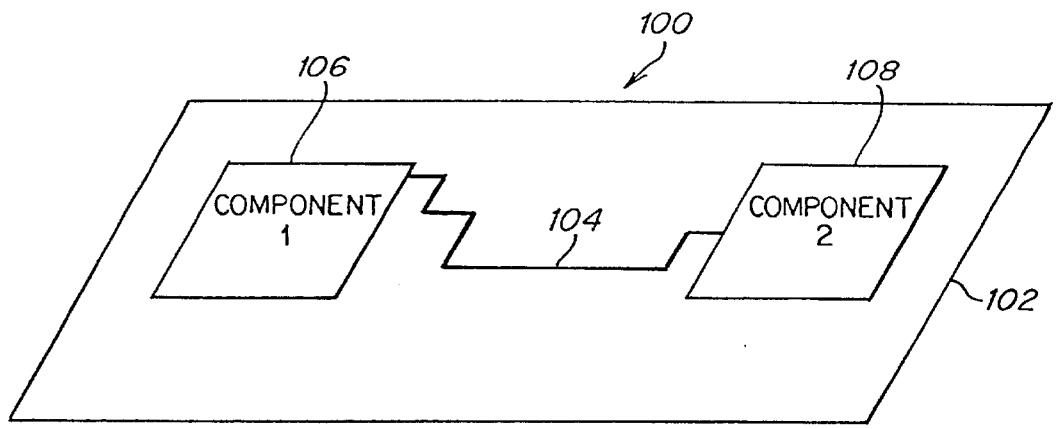
FIG. 1 is a flexible circuit according to an exemplary embodiment of the present invention.

FIG. 1 is a simplified version of an exemplary embodiment of a flexible circuit 100 of the present invention. In this embodiment, flexible circuit 100 includes at least one layer of a flexible substrate 102, conductive material 104 located on the flexible substrate 102, and at least one component 106 located on the flexible substrate 102. However, for explanation. the flexible circuit 100 shown in FIG. 1 also includes a second component 108.

The term flexible substrate as used herein may refer to either an insulating flexible substrate or a conductive flexible substrate depending on the context in which it is used.

In one embodiment, the flexible substrate 102 may be capable of providing an insulating layer for the flexible circuit. Examples of acceptable flexible insulating substrates 102 for implementation of the present invention include acrylic, poly-imid, polycarbonate, polyester, mylar, or other plastics.

Additionally, the thickness of the flexible circuit 100 should be thin enough so that when integrated into, for example, a wallet, it does not cause the wallet to be appreciable thickened. Preferably, the flexible substrate is less that 1 mm thick. In a preferred embodiment, the present invention utilizes a flexible substrate of poly-imid that is about 0.2 mm thick and components about 1.2 mm thick.

In another embodiment, the flexible circuit 100 may include a plurality of layers of flexible substrate 102. This embodiment will be discussed in greater detail below.

Overlaid upon the flexible substrate 102 is a conductive interconnection pattern composed of conductive material 104. The conductive material may be any material that conducts electrical charges, such as metal or conductive ink. The metal or conductive ink of the conductive material 104 may be applied to the substrate using photolithography or by printing, depending on what type of conductive material 104 is used. This process can be repeated with one or more additional layers of flexible substrate 102 and conductive material 104.

In the embodiment of FIG. 1, the conductive material 104 serves to electrically connect components 106 and 108 of flexible circuit 100. The flexible circuit 100 according to one embodiment of the present invention may be folded, at least along one axis. Thus, the connecting material 104 may also provide for folding, at least at some location.

In another embodiment, the flexible substrate 102 may fabricated of a flexible conductive substrate, such as Teflon. In this embodiment, the electrical connection is not made by the conductive material, but, rather by the flexible substrate 102 itself. Instead of overlaying connective material, portions of the flexible substrate 102 are removed and the remaining conductive portions serve to electrically connect the components.

The components 106 and 108 may be various off-the-shelf electrical components such as an integrated circuit chip. These components 106 and 108 are mounted to exposed conductive surfaces on the flexible substrate 102. The exposed conductive surfaces may be created by the interconnection material 104. Alternatively, the exposed conductive surfaces may be the conductive portions of a conductive flexible substrate 102 that have not been removed.

Figure 2:
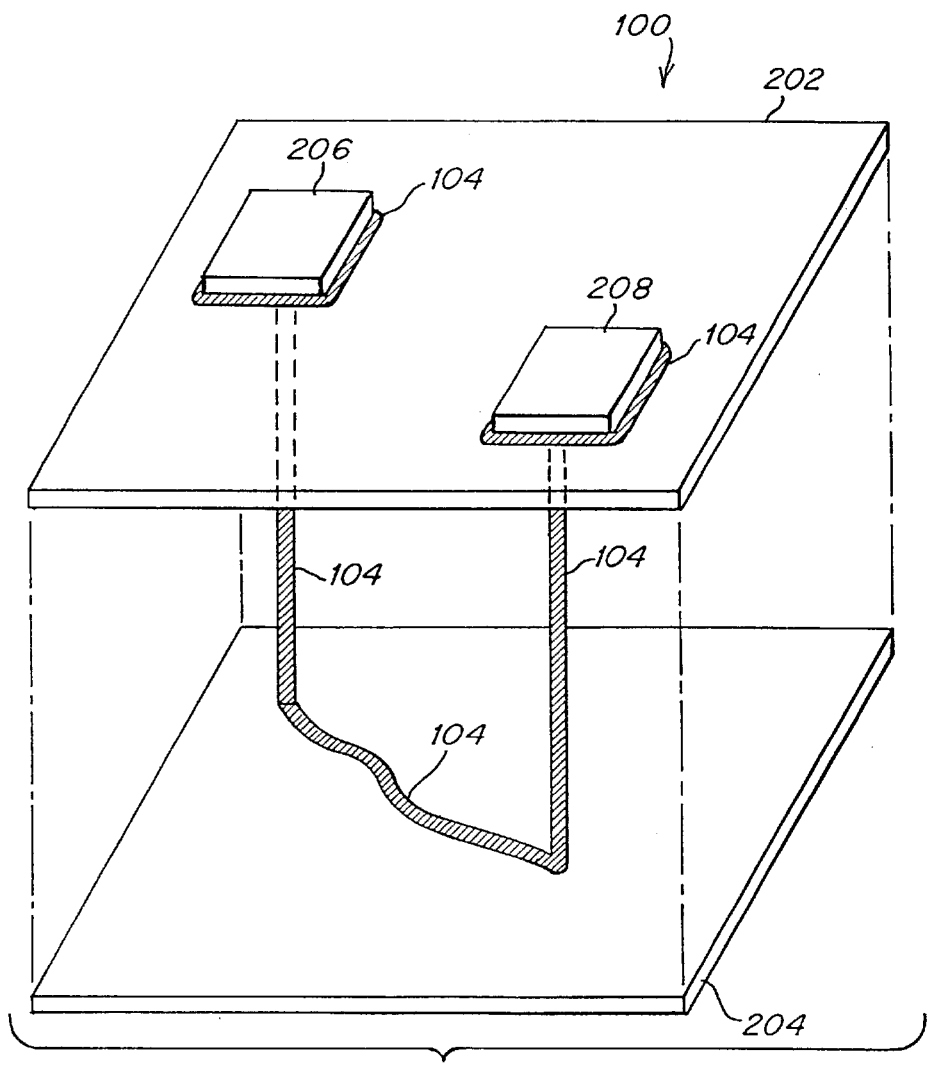
FIG. 2 is another embodiment of a flexible circuit having two layers of flexible substrate.

FIG. 2 discloses an exemplary embodiment of the present invention where the flexible circuit 100 includes two layers of flexible substrate, an upper layer 202 and a lower layer 204. As shown, the upper layer 202 and the lower layer 204 are separated from one another. However, according to one embodiment of the present invention, the two layers may be fixedly connected to one another. Preferably, the layers are connected in such manner that they act as a single member when flexed. For example, the layers may be connected by a thermo-set adhesive acrylic or the like.

Deposited on both the layers of flexible substrate (202 and 204) is a layer of conductive material 104. Taking first the upper layer 202, the conductive material 104 is deposited in the regions under the components 206 and 208, both of which are preferably fixedly attached to the upper flexible layer 202. Beneath each region there lies a via (not shown) that allows for the conductive material 104 to pass through the upper layer 102. Tile term "via " as used herein shall refer to a opening that passes through a layer of flexible substrate and is partially or completely filled with conductive material.

A portion of the conductive material 104 is also deposited on a portion of the lower layer 204. In this manner, the conductive material 104 may be thought of as beginning on the upper layer 202, passing through the upper layer 202, traversing across the lower layer 204, passing back through the lower side of the upper layer 202 and thereby, electrically connecting components 206 and 208 together. In this manner, there is more surface area to place the conductive material 104 in order to electrically connect the components. In turn, this allows for more interconnections because of the multiple levels that may be created and therefore, a manufacturer does not have to worry about portions of conductive material 104 crossing each other. Thus, more electrical connections are allowed between components of the flexible circuit 100. In turn, this allows for a greater number of connections in a minimal amount of space.

The components 206 and 208 are preferably located in specific locations where the flexible substrate 200 will not typically be folded or bent. The components are preferably covered with a layer of epoxy.

Placing the components away from fold location or area of high bending allows for rigid epoxying encapsulation of all the components and provides local stiffness for the components. The epoxy also serves to seal the components for moisture and prevents mechanical stress-induced breakdown of the components.

Figure 3:
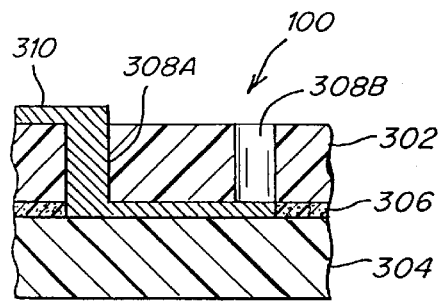
FIG. 3 is a cut-away side view of an exemplary embodiment of the flexible circuit according to the present invention.

Referring now to FIG. 3, a cutaway side view of a flexible circuit 100 according to an exemplary embodiment of the invention is shown. The cutaway view shows a lower flexible substrate layer 304 and an upper flexible substrate layer 302. The upper flexible substrate layer 302 has a via 308A that passes through it and which is filled with conductive material 310. The conductive material 310 allows for the upper surface of the upper layer 302 to be electrically coupled to the conductive material 310 deposited on the upper surface of the lower layer 304.

The upper layer 302 also has a hole 308B which passes through it. The term "hole" as used herein will refer to a via that is not filled with conductive material. That is, a hole as used herein, is a region in a region of a flexible substrate that is devoid of any flexible substrate.

As shown, there is one hole 308B and one via 308A. However, this is by way of example only and as one skilled in the art would readily realize, the number of vias is dependent upon how many layers there are as well as how many interconnections between component are needed in the flexible circuit. Additionally, the number of holes will effect the stiffness of the unitary piece of combined layers of flexible substrate with the more holes providing for a more flexible substrate.

In a preferred embodiment, the two layers 302 and 304 are adhered together in all places where there is not conductive material 310 or holes or via passing between the two layers. Preferably, the adhesive 306 which adheres the two levels together is applied around the perimeter of the flexible circuit and there is no conductive material near the perimeter so a seal is maintained around the entire perimeter of the flexible circuit.

The components may be connected to the exposed conducting areas using standard means, such as wire bonding or soldering. Additionally, the components may be connected to the flexible circuit by adhering the electrical connections of the components to the conductive material using conductive epoxy. In another embodiment, the electrical connections of the components may have solder bumps attached to them. In this embodiment, the upper layer 302 of the flexible circuit may have holes through it which expose portions of the conductive material located on the lower layer 304. The component is then placed on the flexible circuit such that the bumps align with the holes. Once placed, the area of connection is heated causing the solder bumps to flow into the holes and thereby, electrically connecting the component lower layer 304.

Figure 4:
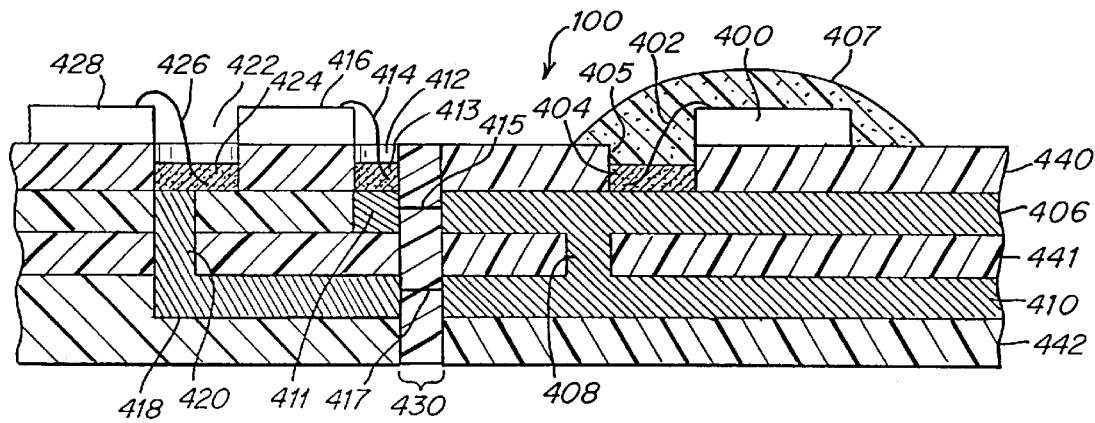
FIG. 4 is a cut-away side view of exemplary electrical interconnections between a plurality of components attached to an exemplary embodiment of the present invention.

FIG. 4 shows a cutaway side view of an exemplary embodiment of a flexible circuit 100. The embodiment shown includes three components, a first component 400 and second component 416 and a third component 428. In this particular embodiment, all three components are electrically coupled together as will be discussed in greater detail below. However, one of ordinary skill will readily realize the that interconnections shown are by way of example only and the all three components need not be electrically coupled together.

The embodiment shown includes three layers of flexible substrate. Specifically, the embodiment includes an upper layer 440, a middle layer 441, and a bottom layer 442. Various layers of conductive material are disposed between adjacent layers.

The first component 400 is electrically coupled to a first conductive layer 406 by soldering a component lead 402 to a bonding pad 404. As is well known in the art, a bonding pad is composed of an aluminum alloy. The component lead 402 passes through the upper layer 440 by means of hole 405. Preferably, the component 400 is fixedly attached to the upper layer 440 by coating it with a globule of epoxy 407. The bonding pad 404 electrically couples the component lead 402 to the first layer of conductive material 406.

The first conductive layer 406 is also electrically coupled, through via 408, to a second conductive layer 410 which is disposed between the middle layer 441 and the bottom layer 442. The electrical connection through via 408 allows the first component 400 to be electrically coupled to both the first and second conductive layers, 406 and 41 0, respectively.

The first conductive layer 406 is electrically coupled, across a hinge area 430 by connector 415, to a third conductive layer 411. Both the hinge area 430 and the connector 415 will be discussed in greater detail below. As described above, the third conductive layer 41 1is electrically coupled to the second component 416. That is, the second component 416 is electrically connected to the third conductive layer 411 by soldering a component lead 414 to a bond pad 413.

The second conductive layer 410 is electrically coupled, across the hinge area 430 by connector 417, to a fourth conductive layer 418. The fourth conductive layer 418 is electrically coupled to the third component 428. The third component 428 is electrically connected to the fourth conductive layer 418, which passes through via 420, by a wire bond 426 that passes through hole 422 and is secured by a bond pad 424. The process of wire bonding may implemented by automated machinery and is well known in the art.

Arranging the conductive material in the manner as shown in FIG. 4, serves to electrically couple all of the components together. This may be desired, for instance, if the first component 400 is a clock which generates a clock signal that is needed by both the second and third components, 416 and 428, respectively.

Figure 5:
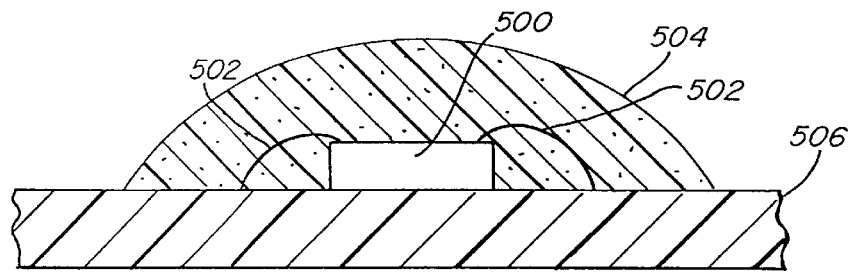
FIG. 5 is a cut-away side view disclosing a component attached to an exemplary flexible circuit and covered by an epoxy globule.

As stated above, preferably, each component, or groups of components, are covered by an epoxy globule. FIG. 5 is an exemplary embodiment showing a component 500 covered by an epoxy globule 504. As shown, the component 500 is electrically coupled to conductive material (not shown) by wire bonds 502 in a manner similar to that described in relation to FIG. 4. The epoxy globule 504 may serve at least two purposes. First, the globule 504 fixedly attaches the component 500 to the flexible substrate 506. Second, the globule creates a hard casing for the component 500 which provides protection from mechanical stress and pressure that may be exerted on the component 500.

Figure 6:
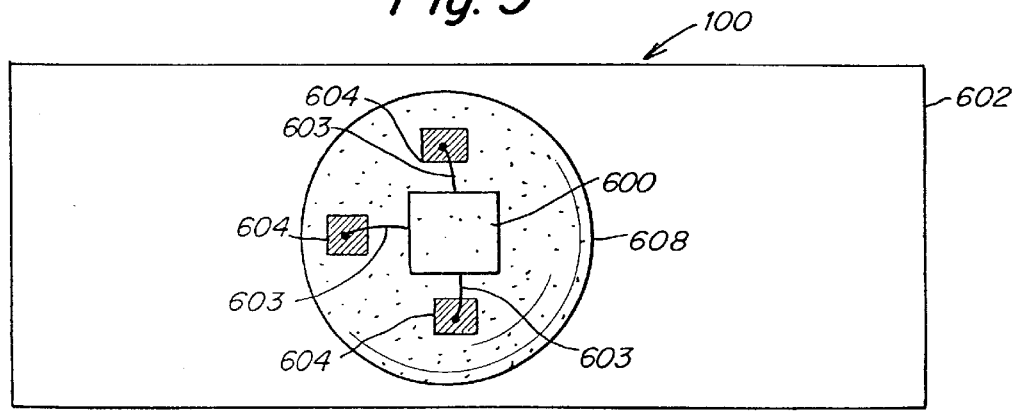
FIG. 6 is an overhead view of a component electrically connected to a flexible substrate and being covered by an epoxy globule.

FIG. 6 is a top plan view of component 600 attached to a flexible substrate 602. As described above, the component 600 may be attached to the flexible substrate 602 by a variety of known techniques. As shown in FIG. 6, the component 600 is attached by the well-known process of wire bonding where the wire bond 603 connects various exposed portions of conductive material 604 to the component 600. In this manner, the component 400 may be connected to a plurality of different components by each different exposed portion of connective material 604. Preferably, a bond pad (not shown) securely attaches the wire bond to the conductive material 604. The exposed portions of the connective material 604, the wire bonds 603 and the component 600 are all encased (encapsulated) by an epoxy coating 608. This epoxy coating 608 may, in some embodiments, cover more than one component 400. The area encapsulated by the epoxy coating, 608 is relatively rigid compared to the flexible substrate 602 and will be referred to herein as loci. This provides a seal that allows a component 600 to withstand mechanical stress and strain as well as the ability to be submerged in liquids. As will be discussed in greater detail below, the regions covered by epoxy (loci) should be arranged on the flexible substrate 602 such that they do not contact or come too close to a location where the flexible circuit 100 will be folded. Thus, not only is the way in which the component 600 is attached to the flexible substrate 602 important, but also their location on the flexible substrate 602 is of high importance.

In one embodiment, the circuit is a computing device. As used herein, the term computing device refers to any device that may receive data and perform manipulations on the data. For example, as used herein the term computing device includes a computer, a calculator, a personal organizer, a video game, and the like. However, the use of the present invention is not limited to a computing device and the teachings contained herein may be readily applied by one of ordinary skill to any circuit where flexibility is required.

Figure 7:
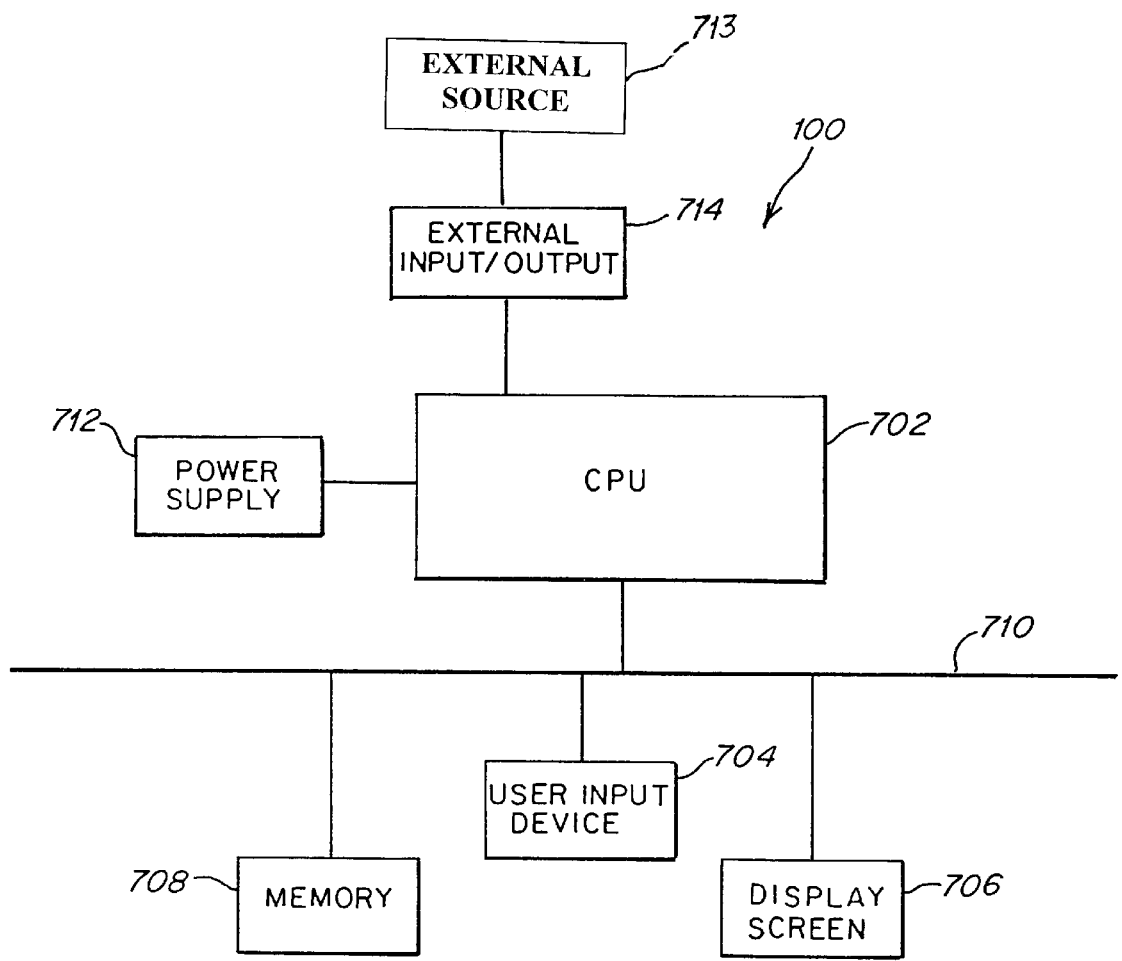
FIG. 7 is a block diagram disclosing some possible components that allow the flexible circuit to operate as a computing device.

FIG. 7 discloses an exemplary flexible circuit that is implemented as a computing device. The flexible circuit 100 includes a central processing unit 702 (CPU). The CPU 702 is connected to, and may communicate with, a user input 704, a display screen 706, and memory 708 via a central bus 710. The flexible circuit 100 receives power from a power supply 712. Additionally, the flexible circuits 100 may also include an external input/output port 714 for receiving information and/or power from an external source 713.

The CPU 702 may be any commercially available processor such as a Motorola 8080, an Intel Pentium, and the like. In a preferred embodiment, the CPU 702 is an 8-bit microprocessor which is capable of communicating with a standard personal computer (PC). The communication with a standard PC is conducted through the external input/output (I/O) port 714. The CPU 702 should also be capable of driving the display screen 706 and receiving information from the user input 704. Further, the CPU 702 processor may have an internal clock (not shown) which drives its operation. This clock may alternatively, be external to the CPU 702.

The user input 704 may be any input device that is capable of receiving inputs from a user and communication these inputs to the CPU 702. Suitable input devices could include a keyboard, a mouse, a keypad, an audio receiver such as a microphone, a light responsive input, a temperature sensor, a pressure sensor and the like. Preferably, the user input 704 includes at least one non-contact keypad. Multiple non-contact keypads may be formed by placing the user input 704 in a variety of locations where the flexible circuit 100 will typically not be folded or bent. In one embodiment, the user input 704 may be integrated into the display screen 706.

The display screen 706 may be any type of screen capable of displaying information received from the CPU 702. Preferably, the display screen 706 is a flexible LCD display screen. In a preferred embodiment, the display screen 706 may also be a flexible "touch screen" that is responsive to contact so that a user may manipulate and reposition data by merely touching the display screen 706. An LCD display may be driven by chips that are mounted to commercially available TCP tabs between the flexible substrate and the display screen 706. Alternatively, the rows and columns may be driven by chips mounted on the flexible circuit itself.

In another preferred embodiment, the display screen 106 may be a light transmissive display that is capable of being read from either side. As used above, the term "display screen" has been used to denote the means by which information is ultimately conveyed to the user of the flexible circuit. However, as one of ordinary skill will readily realize alternative means for conveying information to a user are within the scope of the present invention. For instance, the display screen 706 may be replaced with or accompanied by an audio output that is used to convey information to the user. Additionally, there may be added to the flexible circuit a device that causes the circuit to vibrate or transmit light in order to alert the user of information. In additional, multiple display screens 706 may be present, all which are preferably electrically coupled together to create a larger display and are all connected to the flexible circuit 100 in locations that typically will not be folded.

The memory 708 may be any type of memory that is capable storing data in a computing device. This includes but is not limited to any commercially available random access memory (RAM) and the like. In one embodiment, the memory 708 is 512 K low power static RAM. In another embodiment, the memory 708 includes both RAM and non-volatile (flash) memory.

Preferably, the flexible circuit 100 is portable, but a non-portable device is also contemplated by the present invention. In a portable embodiment, the power supply 712 is typically a battery, and preferably is a rechargeable battery. To allow for more flexibility of the circuit 100, the power supply 712 may be a flexible rechargeable battery. In this embodiment, the power supply 712 may be rechargeable by inductively coupling a charging source to the power supply. In this embodiment, the power supply 712 may include an electrically conductive loop that, when placed in proximity to a charging loop of a fixed charging source, acts as the receiving, portion of a transformer and thereby, may recharge the power supply 712. In another embodiment, the power supply 712 is backed by a second backup power supply (not shown) which may be permanently integrated into the computing device 100 or may be replaceable.

The external I/O port 714 may take on several various forms and more than one may be included in the flexible circuit 100. Generally, the external I/O port 714 allows for the flexible circuit 100 to effectively receive and/or transmit information to and from an external source 713. For example, the I/O port 714 may be a 4-pin connector designed to be used with a PC cable or a dedicated battery charger cable. Additionally, the external I/O port 714 may be a direct serial or parallel data connection such as an RS-232 cable or a USB connection. Alternatively, the external I/O port 714 may be an infra-red (IR) or light detector/transmitter capable of receiving and transmitting, respectively, IR or light signals. In another embodiment, the external I/O 714 may be an RF data modem or pager. In yet another embodiment, the external I/O 714 may be an acoustic telephone dialer capable of dialing a phone number.

Alternatively, the external I/O port 714 could be an antenna which is capable of transmitting and/or receiving data from an external source such as a PC. In the embodiment employing an antenna, the antenna may be directly molded into the flexible circuit. That is, the antenna may be connected to the top of the flexible circuit or, alternatively, it may disposed between layers of the flexible circuit. This antenna, may also be serve as the inductive recharging loop described above.

In another embodiment, the external I/O 714 may include contact points for contacting a smart card. In this embodiment, the external I/O 714 is preferably configured such that it read and write information to an from the smart card. In this manner, the external I/O 714 may be thought of the "master" which drives the "slave" smart card. Further, the smart card itself may include an I/O port allowing the smart card to receive information from an external source which may then be read by the external I/O 714. In order for the external I/O 714 to communicate with a contact smart card, it is preferably that the external I/O 714 be created by intentionally deforming the flexible circuit 100 such that portion of conductive material are exposed and may physically contact the smart card. This will be described in greater detail below.

In a further embodiment, the external I/O 714 may be a device capable of transmitting information to the elements of a Personal Area Network (PAN) to create a "wearable computer." That is, the external I/O 714 may be capable of receiving information from and transmitting information to a plurality of devices, each of which may have their own external I/O's. In this manner, the external I/O 714 may enable the flexible circuit 100 to act as a relay between several body-worn peripheral devices, such as glasses, a watch, or an ear-mounted phone, in a "hub and spoke" configuration.

Thus, depending on which type(s) of external I/O port 714 is included, the flexible circuit may be able to communicate with any number of external peripheral devices such as a smart card, a contact-less smart card, a credit card emulator, a printer, a disk, a scanner, and the like. The above identified I/O devices are not exclusive of one another. That is, it is within the scope of the present invention to have many of these I/O devices integrated into the flexible circuit.

The various components just described are but a few of the possible components that may be integrated into the flexible circuit 100 of the present invention. As will be discussed in greater detail below, the flexible circuit 100 may include additional components. Further, because the present invention has preferably integrated all of the components into a sealed unit, the flexible circuit is not easily alterable and any attempted alterations may result in destruction of the flexible circuit. This adds a level of security to the present invention such that it may not be altered by an unauthorized person.

Figure 8A:
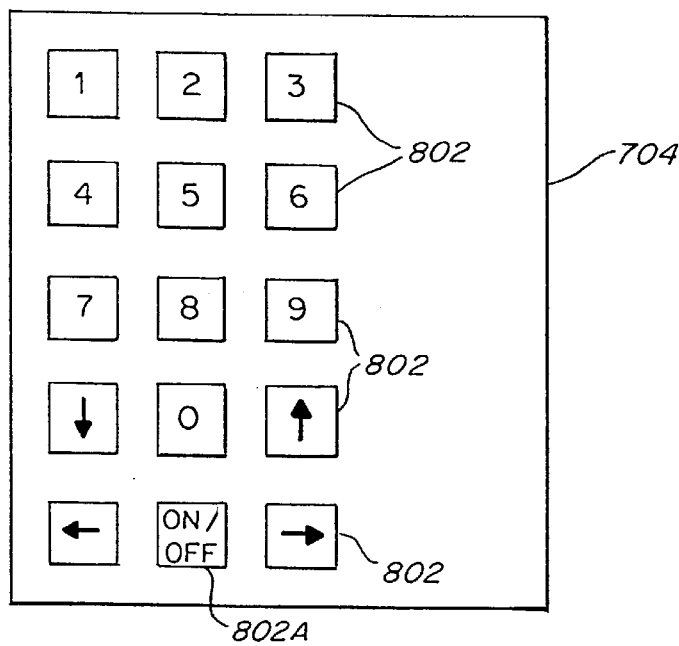
FIGS. 8A–8C disclose various aspects of a preferred user input according to one embodiment of the present invention.

FIG. 8A discloses a preferred embodiment of the input device 704. The input device 704 includes a plurality of input keys 802 which may receive information from the user when touched. The keys 802 may be any known type of keys that are capable of receiving information, for example they may be keypad buttons similar to a conventional calculator, where depressing the key causes contact between a row and a column of electrical circuitry behind the key. In a preferred embodiment, the keys 802 are not this type of so-called "contact keys" but rather are non-contact capacitive keys. In this preferred embodiment the input device 704 is a keypad or slider incorporating either capacitive, inductive or contact sandwich coupling keys to facilitate user data entry and is a so-called non-contact input device. In another embodiment, the input device is co-located with the display. Such a device is implemented by printing conductive materials on various layers of the display.

One key that is called out in FIG. 8A is key 802A, which is an on/off key. This on/off key 802A may be the primary means of turning the electrical circuit on and off depending on whether the circuit is in use or not. However, the on/off key 802A may not be present if the flexible circuit is implemented in a housing that may be folded in the manner such that all of the keys 802 are simultaneously touched. This may occur for instance when the flexible circuit is integrated into a wallet. As the wallet is closed, the two sides of the wallet contact each other and thereby all of the keys 802 are touched.

Figure 8B:
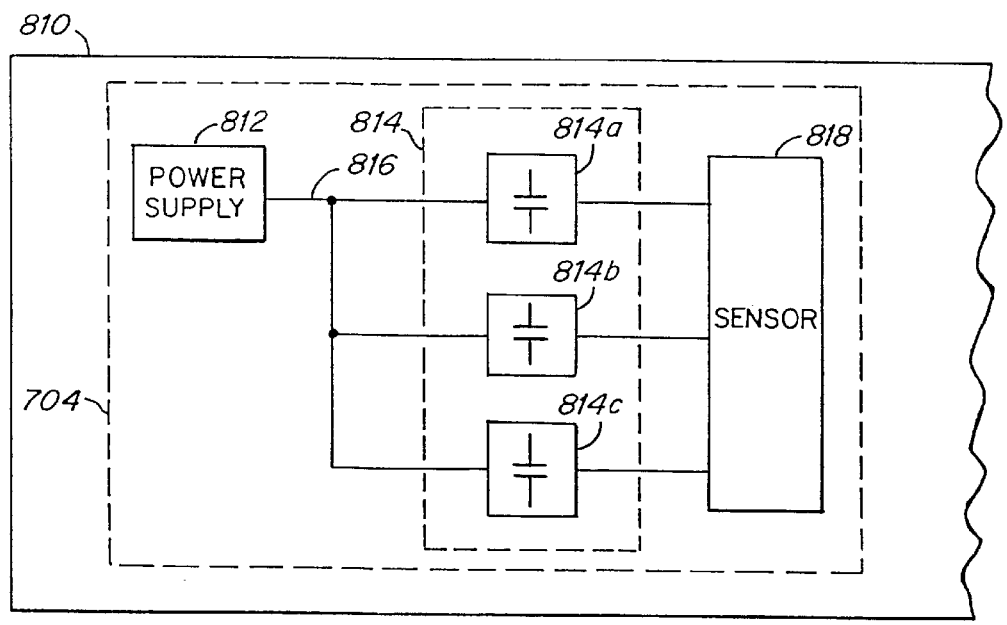

FIG. 8B discloses a non-contact user input 704 according to one embodiment of the present invention. The user input 704 includes a plurality of keys 814a, 814b, and 814c. Only three keys (814a, 814b, and 814c) are shown in FIG. 8B, however, one would readily realize that the number of keys 814 may vary.

Each key may be connected to a power supply 812, by connective material 816. Each key may also be connected to a sensor 818. The entire user input 704 is preferably attached to the flexible substrate. In a preferred embodiment, the keys 814 are physically integrated into the flexible substrate 810. In an alternative embodiment, the keys 814 are fixedly attached to the surface of the flexible substrate 810.

Preferably, the keys 814 are made of a material which has an intrinsic capacitance, an example of such a material is copper. The power supply 812 provides an initial charge which charges the capacitance, show in phantom, of each of the keys 814 for a short period of time. Preferably, this period is about ten milliseconds. Then the power supply 812 is turned off. As soon as the power supply is turned off, the voltage stored in the intrinsic capacitance of the keys 814 begins to discharge. The sensor 818 senses and times this discharge. If a key (e.g., 814a) is not being pressed, the key will discharge to a certain level in a specified amount of time. The sensor 818 is preferably programmed to know when this time is. However, if a user is touching the key, the capacitance of the key changes. This change in capacitance (increasing capacitance) causes the key to discharge more slowly. The sensor detects this decrease in the discharge speed, and in this manner may detect which of the keys 814 are being pressed.

Figure 8C:
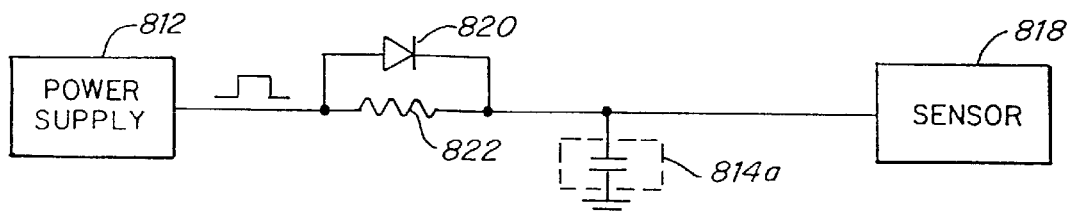

Referring now to FIG. 8C, a more detailed version of the key 814a and its associated circuitry is disclosed. As shown in FIG. 8C, only a single key and its associated circuitry are shown. However, it will be readily apparent to one of ordinary skill that the same circuitry will be applied for each key on the user interface 704.

The power supply 812 provides a pulsed output which remains in a high state long enough to fully charge the intrinsic capacitance of the key 814a. To reduce the amount of time it takes to charge the capacitor, a diode 820 is preferably provided that allows for a relatively resistance free charging of the capacitor key 814a. The associated circuitry of the key 814a may also include a resistor 822. As is well known, this resistor, in combination with the inherent capacitance of 814a, provides for a voltage decay curve that varies roughly with the product of the product of the resistance of the resistor 822 and the capacitance of the key 814a. This decay occurs when the output of the power supply 812 is in its low state and the capacitor has been fully charged. The voltage decays through the resistor 822 to ground (i.e., the power supply 812 in a low state). The voltage decay is monitored by the sensor 818 and the sensor 818 preferably is programmed to know that if the voltage across the capacitor has not been reduced to a certain level in a certain amount of time, the key 814a has been pressed. This is due to the increase in capacitance from any charge storing object such as a human finger, touching the key 814a.

In a preferred embodiment, the power supply 812 provides the charging pulse for 10 microseconds and the time constant for the RC circuit of resistor 822 and key 814a is approximately 3 microseconds.

Figure 9:
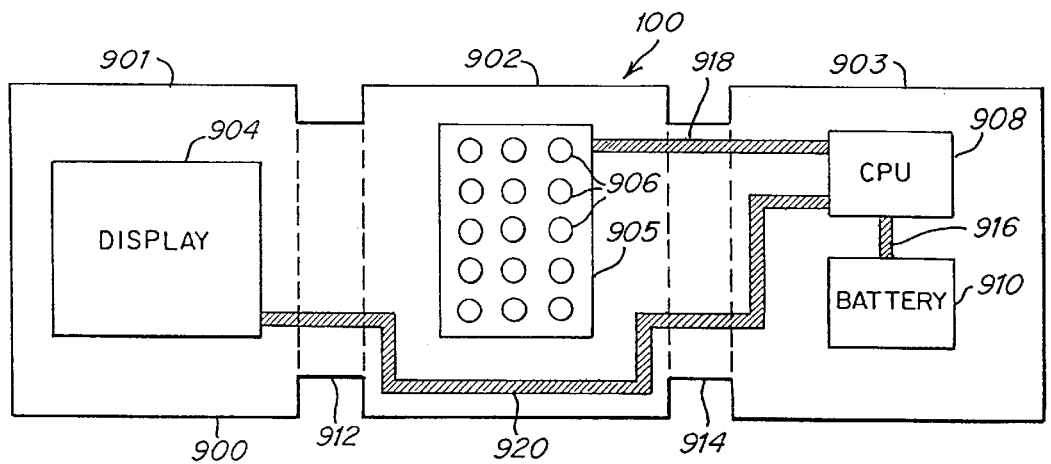
FIG. 9 is one embodiment of the flexible circuit implemented as a computing device having a display screen a user input.

FIG. 9 is a functional block diagram of one exemplary embodiment of a flexible circuit 100 according to the present invention. In this embodiment, the flexible circuit 100 includes a flexible substrate 900. The flexible substrate 900 has three panels, a first panel 901, a second panel 902 and a third panel 903. The first panel 901 has a display screen 904 attached to it. The second panel 902 has a user input device 905 attached to it. The user input device 905 in this example, contains a plurality of keys 906, arranged in a manner similar to a calculator. The third panel 903 has a CPU 908 and a battery 910 fixedly attached. The three panels are separated from their adjacent neighbor by two hinge areas, the first hinge area 912 and a second hinge area 914. That is, the first panel 901 is separated from the second panel 902 by a first hinge area 912 and the second panel 902 is separated from the third panel 903 by a second hinge area 914. The first and second hinge areas 912 and 914, respectively, are locations where the flexible circuit 100 may be repeatedly folded. The flexible circuit 100 may be repeatedly folded along the hinge areas when the flexible circuit is integrated into a wallet.

The battery 910 provides power to the CPU 908. The power from the battery 910 is transferred to the CPU 908 by conductive material portion 916 which connects the battery 910 to the CPU 908. The CPU 908 receives input from the user input 905 through conductive material portion 918. The conductive material portion 918 is connected directly to both the CPU 908 and the user interface 905. The conductive material portion 918 crosses the second hinge area 914. As would be readily apparent, the conductive material portion 918 in the region of the second hinge area 918, must be able to withstand repetitive folding and unfolding without losing its conductivity between the CPU 908 and user interface 905. Methods of fabricating such a long life area of conductive material will be discussed below.

The display screen 904 is also connected to the CPU 908. The connection between the two is made by conductive material portion 920. The conductive material portion 920 crosses both the first hinge area 912 and the second hinge area 914. All of the components disposed on the flexible substrate 900 are preferably located in regions that are away from the first hinge area 912 and the second hinge area 914. Placement of the components in this manner ensures that the components do not interfere with the folding of the flexible circuit 100 in the region of the hinge areas.

As shown in FIG. 9, the flexible circuit 100 is integrated onto a single layer of flexible substrate 900. In order to create more surface area on which the conductive material may be placed, a plurality of flexible substrate layers may be used, as discussed above. The use of multiple layers also may reduce the amount of conductive material that has to be used. For example, if the conductive material 920 that connects the display 904 to the CPU 908 was on a different level, it would not have to traverse the edges of the user interface 905 and could pass directly underneath the user interface 905. By allowing this straight line connection. less conductive material may need to be used and planning and fabrication of the circuit may become easier and cheaper.

Figure 10A:
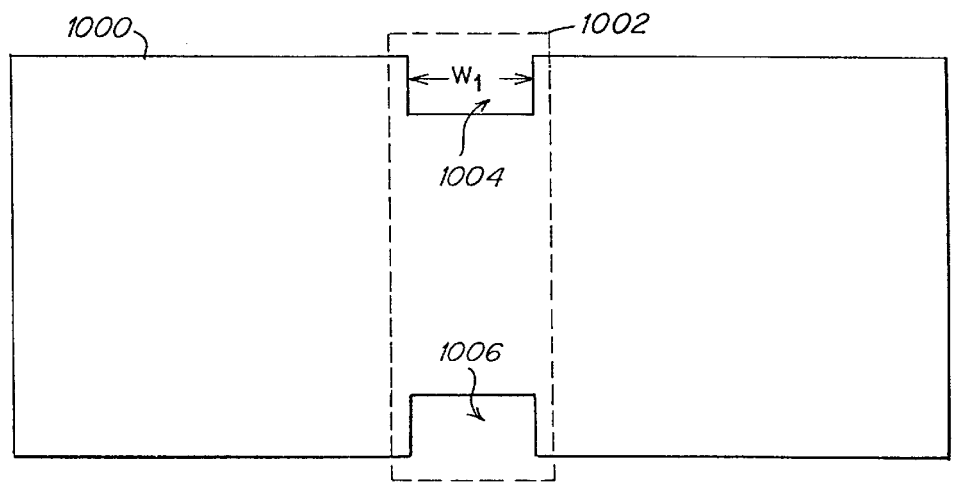
FIGS. 10A–10B disclose one embodiment of the present invention that allows for easy folding along a hinge area.

FIG. 10A discloses an exemplary configuration for a flexible substrate 1000 that provides for high flexibility coupled with a reliability to repeated hinging (e.g. over 10,000 repeated opening and closing cycles for a wallet) along the hinge area 1002. The hinge area 1002 includes two cutout sections 1004 and 1006, both of which have a width $W_1$. By removing these sections, the flexible substrate 1000 is more flexible in the hinge area 1002. Therefore, the flexible substrate 1000 may be folded much easier in the hinge area 1002 and the effects of integrating the flexible circuit into, for example, a conventional bi-fold wallet are reduced and the wallet can open and close as a normal wallet.

Figure 10B:
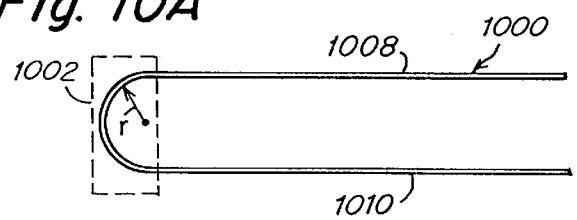

FIG. 10B shows a side view of the flexible substrate 1000 of FIG. 10A in a closed position as it would appear when it integrated into a bi-fold wallet. The hinge area 1002 is deformed into a curved region that is large enough to handle all the components (not shown) attached to the flexible substrate, as well as the material from which the wallet is made. The radius of the curved region of the hinge area 1002 is denoted as r and is larger than the radius of a crease as described below. That is why, as shown, the upper and lower sides, 1008 and 1010, respectively, of the flexible substrate do not touch and the flexible substrate has the curved hinge area 1002.

Referring again to FIG. 10A, the width $W_1$ of the hinge area depends upon the size of the casing into which the flexible substrate 1000 may be integrated in the future. It should be noted that only one hinge area 1002 has been shown. However, if the flexible circuit is to be integrated into a tri-fold wallet (i.e., having two locations where it is folded) two such hinge areas 1002 should be preferably created in the flexible substrate 1000. Further, one of ordinary skill will realize that the flexible circuit may not require such hinge areas or may require more depending upon the application.

As mentioned above, when a component(s) is covered in hard epoxy coating, it provides an area of local stiffness in the region of the loci. Therefore, when designing a flexible circuit according to the present invention, the loci are preferable not be displaced near the hinge area 1002, for placing the loci near the hinge area 1002 will hinder the foldability of the flexible substrate.

Figure 11:
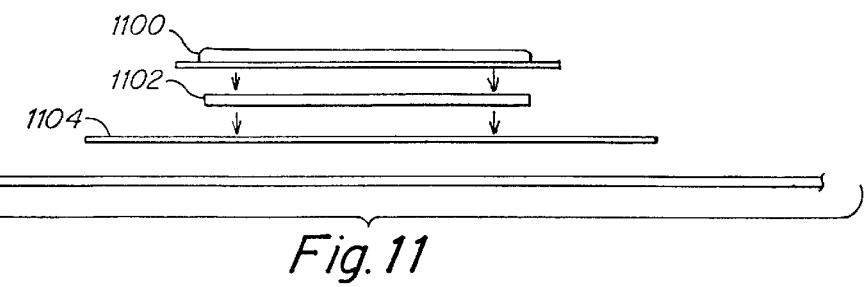

There are several different ways, according to the present invention, in which the display screen may be attached to the flexible circuit. Most generally, and as shown in FIG. 11 in side view, the display screen 1102 is disposed between a plurality of layers, one of which may be a display screen support bracket 1100 which overlays the display screen 1102. Both the support bracket 1100 and the display screen 1102 are attached to the flexible substrate 1104. Thus, in the embodiment of FIG. 11, the plurality of layers consists of the display screen support bracket 1100, the display screen 1102, and the flexible substrate 1104. All of the layers are preferably connected using an adhesive (not shown) that fixedly, at least in localize regions, bonds the layers together.

It has been discovered that fixedly attaching the display screen 1102 to the flexible substrate 1104 does not allow for the maximal amount of flexibility for the circuit as a whole. To overcome this and to provide for greater flexibility, it is preferable to attach the display screen 1102 such that it may travel within a limited range over the surface of the flexible substrate 1104 but such that it is not displaced too far. That is, the range of travel should not be so great that the connection between the display screen 1102 and the flexible substrate 1104 is severed.

For example, and referring now to FIG. 12, the display 1202 is attached to the flexible substrate 1200 by a first heat seal 1204 and a second heat seal 1206. As is well known, the heat seal material of the first and second heat seals, 1204 and 1206 respectively, contains conductive material capable of conducting electricity from conductive material (not shown) on the flexible substrate 1200. This in turn allows for the rows and columns of the display 1202 to be driven by electronics displaced on the flexible substrate 1200. These rows and columns may, respectively, be connected to by connections provided on the upper and lower sides of the connective layer 1208 of the display 1202.

As shown, the first heat seal 1204 is folded back upon itself in order to be able to connect with both the bottom of the connection layer 1208 of the display 1202 as well as the conductive material (not shown) on the flexible substrate 1200 to the connection layer 1208. Similarly, the second heat seal 1206 connects directly from the substrate 1200 to the upper side of the connection layer 1208.

In the embodiment of FIG. 12, the display 1202 is able to traverse across the flexible substrate 1200 and is not anchored other than by the first and second heat seals, 1204 and 1206, respectively. The first and second heat seals 1204 and 1206, are disposed on two adjacent edges of the display 1202. This allows for movement in both the X and Y directions, therefore allowing the display 1202 to move across the flexible substrate 1200. This advantageously allows the flexible circuit as a whole to be stressed without the LCD display 1202 being stressed.

The adjacent edge configuration of FIG. 12 is preferable, however, it is within the scope of the present invention to have both the heat seals 1204 and 1206 displaced on opposite sides of the display 1202. This may however, restrict movement of the display 1202 over the flexible substrate 1200 in one direction.

In another preferred embodiment, the display screen 1200 is attached using a single heat seal, such as the second heat seal 1206. In this embodiment, the second heat seal 1206 may be attached to both the row and columns of the display screen 1200 if the display screen 1200 includes both row and column connections of a single edge.

The following describes preferred embodiments of attaching the display screen 1200 using two heat seal pieces. However, one will readily realize that the following examples employing two heat seal connections may be implemented in the single heat seal connection described above simply by connecting, for example, the second heat seal 1206 to both the rows and columns of the display screen 1200.

Preferably the LCD display 1202 is attached to the flexible substrate 1200 as follows. First, the flexible substrate 1200 may be placed flat and the display 1202 placed upside-down (i.e., with the display facing the flexible substrate 1200) next to the flexible substrate 1200. The first heat seal 1204 is then attached to location on the flexible substrate 1200 where connective material (not shown) for driving either the rows or columns of the display 1202 are located. The first heat seal 1204 is preferably attached using to the flexible substrate 1200 using solder of conductive epoxy. The first heat seal 1204 is then attached to either the upper or lower side of the connection layer 1208 of the display 1202. The first heat seal 1204 may be attached to the connection layer 1208 by applying mechanical force (i.e., squeezing) to both the first heat seal 1204 and the connection layer 1208 at an elevated temperature to fixedly bond the two together. Alternatively, the heat seal 1204 and the connection layer 1208 may be bonded together using conductive epoxy.

The display 1202 is then folded back so that it is right-side up, i.e., facing away from the flexible circuit 1200, and the second heat seal 1206 is then attached to the upper side of the connection layer 1208 and to the conductive material (not shown) for driving the other of the rows or columns on the flexible substrate 1200. Affixing the display 1202 to the flexible substrate 1200 in the manner just described allows for the display 1202 to "float" over the flexible substrate 1200.

Referring now to FIG. 13, a display 1300 that has a well known TCP-style row driver 1302 and a TCP-style column driver 1304 is shown. In this embodiment, the display 1300 is preferably an LCD display. The drivers provide commands to the display 1300 determine whether an individual pixel of the display 1300 will be activated or not. That is, when both the row and column of a pixel have been activated, the liquid crystal at that pixel of the display 1300 shifts and therefore, loses its opaqueness. This creates a dark spot at that pixel. This is well-known in the art of LCD displays and one would readily realize the different types of drivers may be employed for driving, for example, an LCD display capable of displaying images in various colors. The row driver 1302 includes connection means 1306 which may be attached to the flexible substrate and the connecting materials thereon to energize various rows of the display 1300. The row driver 1302 in the embodiment shown in FIG. 13 may be a poly-imid TCP package consisting of a TCP driver chip 1308 attached to a piece poly-imid which is attached to a heat seal 1316. The row driver chip 1308 allows the CPU (not shown) on the flexible circuit to send predefined commands to the display 1300 in order to drive the display 1300. That is, the CPU does not have to actively control the display 1300, but merely transfers one of the set of predefined commands to achieve the desired response and thereby, reduces overhead on the CPU. As the driver 1302 is flexible it may be folded over and bent so that it lies under the display 1300.

The column driver 1304 also includes a TCP driver chip 1312 attached to a heat seal 1318. As shown, the row driver 1302 is attached to the top of the connection layer 1310 of the display 1300 and the column driver 1304 is attached to the bottom of the connection layer 1310.

Referring now to FIG. 14, a display 1400 is shown attached to a flexible substrate 1414. The display 1400 includes a column driver 1404 and a column driver 1402. The respective chips 1408 and 1412 are not visible in the view shown in FIG. 14 because they are disposed and connected to the flexible substrate 1414 on the underside of the flexible substrate 1414. In this embodiment, the conductive material would be disposed on the bottom side of the flexible substrate 1414 and attached by soldering or conductive epoxy.

Figure 15A:
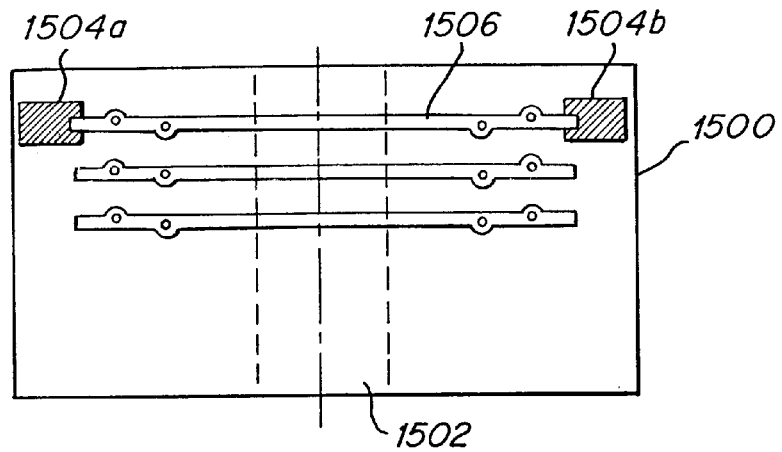

Referring now to FIG. 15A, one exemplary embodiment of a connection between two portions 1504*a* and 1504*b* of connective material by a connector 1506 is shown. Both the connective material and the connector 1506 are connected fixedly attached to the flexible substrate 1500. This flexible substrate 1500 has a pre-designed hinge area 1502 which is the location where the flexible substrate 1500 may be repeatedly flexed and unflexed, for example, when integrated into a wallet. The connector 1506 is disposed between the two portions 1504*a* and 1504*b* of connective material. In a preferred embodiment, the conductor 1506 is composed of copper. However, as one of ordinary skill will readily realize, any conductive material will work provided that the connector 1506 is made of a substance capable of carrying a charge and being repeatedly flexed, e.g., silver, gold, tungsten, aluminum or zinc.

By using the connector 1506, the conductive material, e.g., 1504*b*, is never forced to flex more than the flexing associated due to torsion of the flexible circuit when displaced, for example, in a wallet, i.e., it is never folded. To ensure an electrical connection with the conductive material 1504b and the connector 1506, the connector 1506 preferably overlays a portion of and is fixedly attached to the conductive material 1504b.

Figure 15B:
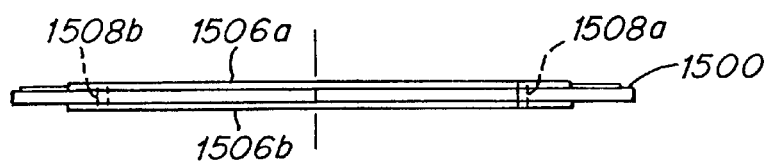

Referring now to FIG. 15B, a side view of an exemplary construction of a hinge area having connector 1506 is shown. In FIG. 15B, a plurality of layers 1506a and 1506b make up the connector 1506. As shown, there is a top layer 1506a and a bottom layer 1506b which, respectively, lie on top of and below the flexible substrate 1500. However, one of ordinary skill will readily realize that only a single connector is required. As shown, the two connectors are connected together through the flexible substrate 1500. This redundancy assures that if one of the pieces of the connector 1506 breaks, the electrical connection between the two portions 1504a and 1504b of the conductive material may still exist. This is ensured by having connector pins, 1508a and 1508b, which are conductive, pass through both portions, 1504a and 1504b, as well through the flexible substrate 1500 such that the two portions are electrically coupled to one another and, therefore provide two possible paths for signals for the conductive material to be transmitted over the hinge area.

Figure 15C:
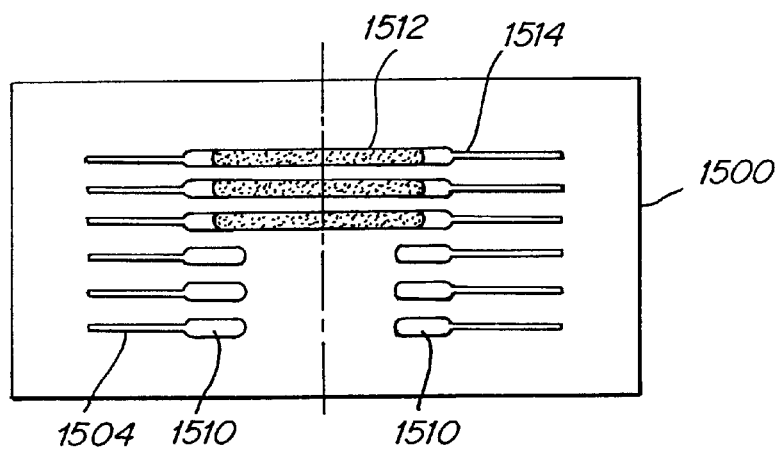

FIG. 15C shows an alternative method of constructing connectors over a hinge area. The conductive material 1504 is terminated by a enlarged conductive plate 1510. In a preferred embodiment, these plates are copper pads which are gold-plated. Between each of the conductive plates is a conductive epoxy bridge 1512 which is made of conductive epoxy adhesives.

Figure 15D:
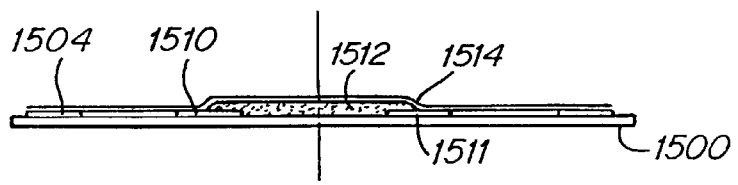

FIG. 15D shows a side view of the flexible substrate 1500 of FIG. 15C. As shown, there is, from left to right, a first piece of conductive material 1504a which is connected to an enlarged connection pad 1510. Between the connection pad 1510 on the left of the figure and the connection pad 1511 on the right of the figure, the epoxy bridge 1512 is placed. This conductive epoxy bridge 1512 is flexible and serves to electrically couple the two paths. In a preferred embodiment, the conductive epoxy bridge and associated pads are covered with a thin film coating 1514.

The following description discloses some preferred embodiments of the present invention as integrated into a wallet. As one will readily realize, the teachings of the following description are not limited only to the context of a wallet and may be implemented in various other manners. For example, the flexible circuit may be integrated into a video game the user wears on their wrist or that is integrated into an article of clothing.

In order for the flexible circuit of the present invention to be integrated into several different housings (i.e., different wallets) the overall length of the flexible circuit should be variable without having to alter the manufacturing process. One possible solution that allows for the length of the flexible circuit 1600 to be easily adjusted is shown in FIG. 16A. The hinge area 1601 comprises a plurality of individual creases 1602, each individual crease 1602 being similar to an accordion. In this manner, the length of the flexible circuit 1600 may be varied simply by folding over one of the accordion creases 1602.

FIG. 16B shows the flexible circuit 1600 of FIG. 16A in side view. The individual creases 1602 alternately rise above and fall below the typical level of the flexible circuit 1600.

FIG. 16C is a side view after the accordion creases 1602 have been flattened and one of them has been folded over.

The folded creases 1604 causes the entire length of the flexible circuit 1600 to be shortened. This in turn allows the flexible substrate 1600 to be produced in one size and easily altered so that it may fit in several different types of wallets without having to make changes in the manufacturing process of the flexible substrate.

Preferably, all of the components of the flexible circuit are attached to one side of the flexible substrate. However, it is within the scope of the present invention that components may be affixed on either or both sides of the flexible substrate. As mentioned above, it is preferable to adhere the components by encasing them in an epoxy cover. The size of the epoxy cover is proportional to how well the epoxy bonds to the flexible substrate. That is, if the epoxy cover is too small it will not adhere to the flexible substrate and the components which they are supposed to cover and adhere to the flexible substrate will pop off the flexible substrate whenever the flexible substrate is bent. However, if the epoxy covers are too large, then the flexible substrate will become too rigid to be effectively displaced within, for example, a wallet. Thus, in order to effectively design a flexible circuit for integration into a wallet, care must be taken to arrange and place the loci of epoxy covered components in regions which are not near a hinge area, a crease, nor near the edge of the flexible circuit and also such that they are covered with the minimum amount of epoxy that will adhere the components to the flexible substrate. It has been found that placing all of the components on one side and arranging them in loci as just described is the most effective way to maintain the flexibility while still having the components fixedly attached to the flexible substrate. Thus, in a preferred embodiment, the flexible substrate is folded over along crease lines so that it may be integrated into a smaller area but still having the maximal amount of surface area on one side in which to mount the components.

Referring now to FIG. 17A, a preferred embodiment of how to achieve the greater surface area for mounting components while keeping the total effective length of the flexible circuit 1700 to a minimum is shown. The flexible circuit 1700 has a back panel 1702, a left panel 1704, and a right panel 1706. The left panel 1704 is actually just a portion of the flexible circuit 1700 that has been creased and is folded over so that it may be coplanar with the back plane 1702. The right plane 1706 is similarly formed.

The back panel 1702 has a length LI which defines the entire effective length of the flexible circuit 1700 when the two creases forming the left and right panels 1704 and 1706, respectively, are formed. However, the usable area on which the components, e.g. 1708 and 1710, may be mounted in this configuration is approximately twice as much as if the flexible circuit 1700 was just composed of a flat back panel 1702. That is, if the back panel 1702 were the only area in which the components could be mounted, the total surface area would defined by $L_1 \times H_1$, $H_1$ being the height of the flexible circuit. However, with the left panel 1704 and right panel 1706 are folded over along a crease line and coplanar with the back panel 1702, the total surface area on which components may be mounted is $L_1 \times H_1$, which is the surface area of the back plane, plus $L_1/2 \times H_1$, which is the area of the left plane 1704, plus $L_1/2 \times H_1$, which is the area of the right plane 1706. In this way, there is effectively twice as much surface area on which to mount components.

By increasing the amount of surface area, there is an effective reduction in the total length of the flexible circuit 1700. As shown, the lengths of the right and left panel, 1706 and 1704, respectively, are each approximately $L_1/2$. However, as one of ordinary skill in the art will readily realize, this number could be smaller or greater, depending upon the application. However, in a preferred embodiment, the length of these left and right panels is approximately ½ the length of the total flexible substrate.

FIG. 17B shows a side view of the flexible circuit 1700 of FIG. 17A. In this embodiment, the flexible circuit contains at least a first loci 1720 and a second loci 1722. The first loci 1720 is fixedly attached to the left plane 1704 and the second loci 1722 is fixedly attached to the back plane 1702. The flexible circuit 1700 is creased at crease 1726 so that the left plane 1704 and the back plane 1702 may lay substantially co-planer to one another. In a preferred embodiment, the first loci 1720 and the second loci 1722 are arranged on their respective planes such that when the flexible circuit 1700 is folded at the crease 1726, they do not contact one another and are separated by a space S. The width of space S is preferably as narrow as possible. Arranging the loci in this manner allows for the flexible circuit 1700 to have the minimum thickness possible while only having components attached on one side.

Referring now to FIG. 18A, an exploded perspective view of an exemplary wallet into which the flexible circuit 1804 may be integrated is disclosed. As shown, there is the top layer of the wallet 1802, the flexible circuit 1804, and a lower layer of the wallet 1806. The top layer 1802 preferably has two cut-outs, 1808 and 1810, which respectively provide openings for a display screen 1812 and a keypad 1814 of the flexible circuit 1804. In a preferred embodiment, neither the screen nor the keypad are directly exposed and each have a transparent and flexible film disposed over them in each of the cut-outs 1808 and 1810.

The flexible circuit 1804 preferably has sewing tabs 1820 that a needle and thread may pass through in order to mount the upper layer 1802 and lower layer 1806 together and firmly affix the flexible circuit 1804 therebetween. As the flexible circuit 1804 is sewn in, there is also preferably a flexible foam rod 1816 is displaced along the area of the primary hinge area. This keeps the flexible circuit 1804 from being folded too sharply when the wallet is in its closed position. The upper and lower layers 1802 and 1806, respectively, comprise the outer casing of the flexible circuit. Preferably, these layer are made of a soft, flexible material. For example, the layer may be made of leather, nylon, eel skin and the like.

FIG. 18B is another exemplary embodiment of the flexible circuit according to the present invention integrated into a conventional bi-fold wallet 1800. In this embodiment, the only visible portions of the flexible circuit are the user interface 1814 and the display screen 1812. Both the interface 1814 and the display 1812 are visible because portions of the wallet 1814 which typically would overlay these components have been removed. The user interface 1814, in this example, is composed of a plurality of keys 1815 which, when touched, provide information to the CPU 702 (FIG. 7). The user display 1812 is preferably a flexible L,CD.

The wallet 1800 is show in its "open" state. That is, the two layers, 1802 and 1806, of the wallet 1800 have been pulled apart. However, as is well known, before being replaced in a person's pocket, the wallet 1800 is typically folded.

Also shown in FIG. 18B are two sensors 1818A and 1818B. These sensors detect when the the wallet is closed, and may therefore, cause the flexible device integrated into the wallet to be turned off. In one embodiment, the sensors 1818A and 1818B are exposed pieces of conductive material that, when contacted together (i.e., when the wallet is closed) complete a circuit and indicate that the computing device should be turned off.

FIG. 19A shows an exemplary assembly of a wallet 1900 having a flexible circuit on the present invention integrated therein. Included in the wallet 1900 is a raised portion 1902 which encloses an input/output connection 1904. This will allow for the flexible circuit to communicate over, for example, a connector 1908 allowing the flexible circuit to communicate with outside sources such as a PC. This is advantageous, for example, for synchronizing a clock on the flexible circuit from a user's home computer, or for a user creating all the information they wish to have stored in the flexible circuit on their home computer and downloading it through the connector 1908.

FIG. 19B is a detailed version of the connection 1904 which may be disposed within the raised portion 1902 and which allows the flexible circuit to be connected to the connector 1908. As shown, the connection 1904 is a fixed tab having a plurality of communication lines 1906, each line being a pin for connection to communication cable. Alternatively, the tab might be extendable and in a hook formation such as shown in FIG. 19C.

In FIG. 20, another exemplary embodiment of the flexible circuit integrated into a wallet 2000 is shown. The wallet includes an opening 2002 which is capable for receiving an external card. For example, a smart card.

FIG. 21A shows an exemplary configuration 2100 of the regions of a smart card (not shown) interface. The exemplary configuration 2100 is preferably the same as the smart card industry standard (the ISO 7816 pattern). As shown, there exists 8 different sections 2102a, 2102b, 2102c, 2102d, 2102e, 2102f, 2102g, and 2102h. Each section is preferably directly contacted by exposed portions (bumps) 2104 of conductive material that extend beyond the upper surface of the flexible circuit. These bumps 2104 are preferably disposed within the wallet such that when a smart card is deposited in the opening 2002 (FIG. 20) the bumps 2104 contact and electrically couple the smart card to the flexible circuit.

FIG. 21B shows a side view of a flexible circuit 100 having two bumps 2104 which extend beyond the upper surface of the flexible circuit 100. Preferably, the bumps 2104 are formed by a portion of conductive material in a via that extends beyond the upper surface of the flexible circuit. In one embodiment, the bumps 2104 may be formed by exerting a mechanical pressure on the underside of the flexible circuit 100 such that a portion of the conductive material in the via is forced above the upper surface of the flexible circuit. This may be accomplished, for example, by embossing the underside of the flexible circuit in the region where the bumps 2104 are to be created.

In a preferred embodiment of the present invention, the flexible circuit here has raised bumps which extend through the leather of the wallet and therefore allow for the connection to the smart card.

Having thus described various illustrative embodiments of the present invention, some of its advantages and optional features, it will be apparent that such embodiments are presented by way of example only and are not by way of limitation. Those skilled in the art could readily device alterations and improvements on these embodiments, as well as additional embodiments, without departing from the spirit and scope of the invention. Accordingly, the invention is limited only as defined in the following claims and equivalents thereto.

What is claimed is:

1. A sealed flexible circuit comprising:
   at least one layer of flexible substrate;
   a conductive material deposited on the at least one layer of flexible substrate;
   a plurality of components fixedly attached to the flexible substrate, and electrically interconnected by the conductive material; and
   a flexible display screen attached to the at least one layer of flexible substrate and electrically coupled to at least one of the plurality of components, wherein the flexible display screen is attached to the at least one layer of flexible substrate such that the display screen may travel in a region above the at least one layer of flexible substrate.

2. The circuit of claim 1, wherein at least one of the components is a microprocessor.

3. The circuit of claim 2, further comprising a flexible user input device fixedly attached and electrically coupled to the at least one layer of flexible substrate.

4. The circuit of claim 2, further comprising an input device, the input device being attached to the at least one layer of flexible substrate and electrically coupled to the microprocessor, the input device receiving information from a user and transferring the received information to the microprocessor.

5. The circuit of claim 4, wherein the input device comprises:
   voltage means for creating a first voltage and a second voltage, the second voltage being a lower voltage than the first voltage;
   a plurality of capacitive keys electrically coupled to the voltage means, at least one of the keys being charged during a time when the voltage means creates the first voltage and discharged when the voltage means creates the second voltage; and
   sensing means electrically coupled to the capacitive keys for timing the discharge of the at least one key.

6. The circuit of claim 2, further comprising a first power supply electrically coupled to microprocessor to provide power to the microprocessor.

7. The circuit of claim 6, wherein the first power supply is a rechargeable battery fixedly attached to the flexible circuit.

8. The circuit of claim 7, further comprising a second power supply coupled to the rechargeable battery, and the second power supply being removable from the flexible circuit.

9. The circuit of claim 7, wherein the rechargeable battery is flexible.

10. The circuit of claim 1, wherein at least one component of the plurality of components is fixedly attached to the at least one layer of flexible substrate by an adhesive cover which contacts both the flexible substrate and the at least one component.

11. The circuit of claim 10, wherein at least two of the plurality of components are covered by the adhesive cover, the at least two components and the adhesive cover defining a loci.

12. The circuit of claim 1, wherein at least one component of the plurality of components is attached to the at least one layer of flexible substrate by solder.

13. The circuit of claim 12, wherein the at least one component is covered by a layer of epoxy, the layer of epoxy contacting the component and the at least one layer of flexible substrate.

14. The circuit of claim 1, wherein at least one component of the plurality of components is attached to the at least one layer of flexible substrate by a wire bond.

15. The circuit of claim 14, wherein the at least one component is covered by a layer of epoxy, the layer of epoxy contacting the component and the flexible substrate.

16. The circuit of claim 1, wherein the plurality of components are located in groups, each group defining a loci.

17. The circuit of claim 16, wherein each loci is covered by a layer of epoxy, the epoxy providing a region of mechanical stability.

18. The circuit of claim 17, wherein the loci are all attached to one side of the flexible circuit and wherein, the loci are arranged so that they do not contact one another when the flexible circuit is folded.

19. The circuit of claim 18, wherein the loci are dispersed on the at least one flexible substrate such that each loci is located on a portion of the at least one layer of flexible substrate that is not repeatedly folded.

20. The circuit of claim 17, wherein each loci is located on a same side of the flexible circuit.

21. The circuit of claim 1, further comprising an external input/output device that receives information from an external source.

22. The circuit of claim 21, wherein the external input/output device is configured to transfer information to and from a smart card.

23. The circuit of claim 22, wherein the external input/output device is a depression in at least one side of the flexible circuit such that a portion of the conductive material may contact the smart card.

24. The circuit of claim 21, wherein the external input/output device is configured to transmit information from the circuit to the external source.

25. The circuit of claim 21, wherein the external input/output device is configured to receive information from a personal computer.

26. The circuit of claim 21 wherein the external input/output device also receives electrical power from an external source.

27. The circuit of claim 26, wherein the external input/output device is an antenna.

28. The circuit of claim 27, wherein the antenna is attached to the at least one layer of flexible substrate.

29. The circuit of claim 27, wherein the circuit includes at least two layers of flexible substrate and the antenna is disposed between the at least two layers.

30. The circuit of claim 1, wherein the flexible substrate comprises a plurality of flexible substrate layers, and wherein the plurality of flexible substrate layers are bonded together such that when the flexible circuit is deformed all of the layers act as a unitary member.

31. The circuit of claim 1, wherein the flexible circuit has an effective total length, the effective total length being equal to a longest edge of the flexible circuit, and wherein the at least one layer of flexible substrate includes a hinge area, the hinge area being displaced a distance less than or equal to about one half of the effective total length from an end of the flexible circuit, the hinge area being a region where the flexible circuit is repeatedly folded.

32. The circuit of claim 31, wherein the plurality of components attached to the flexible circuit are not attached to the hinge area.

33. The circuit of claim 31, further comprising at least one connector that electrically couples conductive material displaced on one side of the hinge area to conductive material displaced on an other side of the hinge area.

34. The circuit of claim 33, wherein the at least one connectors is copper fixedly attached to the at least one layer of flexible substrate.

35. The circuit of claim 1, wherein the flexible circuit has an effective total length, the effective total length being equal to a longest edge of the flexible circuit, and wherein the at least one layer of flexible substrate includes a hinge area wherein the flexible circuit is creased so that the total effective length of the flexible circuit is reduced and an area where components may be mounted is not reduced.

36. The circuit of claim 1, wherein the flexible circuit is configured to operate as a computing device.

37. The circuit of claim 1 disposed in a wallet.

38. The circuit of claim 1, wherein the flexible display screen is attached to the at least one layer of flexible substrate by at least one piece of heat seal material.

39. The circuit as claimed in claim 38, wherein the at least one piece of heat seal material includes conductive material that provides a contact between the flexible display screen and the conductive material deposited on the at least layer of flexible substrate.

40. The circuit as claimed in claim 38, wherein the at least one piece of heat seal material is folded so as to be able to connect with a bottom connection layer of the flexible display screen and to the conductive material deposited on the at least one layer of flexible substrate.

41. The circuit as claimed in claim 38, wherein the flexible display screen may travel in the X and Y directions above the at least one layer of flexible substrate, thereby allowing the at least one layer of flexible substrate to be flexed without putting stress on the flexible display screen.

42. The circuit of claim 1, wherein the flexible display screen is attached to the at least one layer of flexible substrate by a first piece of heat seal material and a second piece of heat seal material, the first and second pieces of heat seal material being connected to adjacent edges of the flexible display screen.

43. The circuit as claimed in claim 42, wherein the first piece of heat seal material and a second piece of heat seal material include conductive material that provides a contact between the flexible display screen and the conductive material deposited on the at least layer of flexible substrate.

44. The circuit as claimed in claim 42, wherein the first piece of heat seal material and a second piece of heat seal material are folded so as to be able to connect with a bottom collection layer of the flexible display screen and to the conductive material deposited on the at least one layer of flexible substrate.

45. The circuit as claimed in claim 42, wherein the flexible display screen may travel in the X and Y directions above the at least one layer of flexible substrate, thereby allowing the at least one layer of flexible substrate to be flexed without putting stress on the flexible display screen.

46. The circuit as claimed in claim 1, wherein the flexible display screen may travel in the X and Y directions above the at least one layer of flexible substrate, thereby allowing the at least one layer of flexible substrate to be flexed without putting stress on the flexible display screen.

47. A flexible computing device comprising:
 a flexible substrate including a plurality of flexible layers, each layer being fixedly bonded to each adjacent layer such that when the flexible computing device is flexed, the plurality of layers act as a unitary member, the plurality of layers including a top layer;
 a conductive material disposed on at least one of the plurality of layers;
 a plurality of components, some of which are fixedly attached the top layer of flexible substrate, each component being electrically coupled to at least one other component by the conductive material; and
 a flexible display screen attached to the top layer of the flexible substrate and electrically coupled to at least one of the plurality of components by a portion of the conductive material, wherein the flexible display screen is attached to the top layer of flexible substrate such that the display screen may travel in a region above the top layer of flexible substrate.

48. The flexible computing device as claimed in claim 47, wherein the flexible display screen may travel in the X and Y directions above the top layer of flexible substrate, thereby allowing the flexible substrate to be flexed without putting stress on the flexible display screen.

* * * * *